(12) United States Patent
Kondo et al.

(10) Patent No.: US 9,211,626 B2
(45) Date of Patent: Dec. 15, 2015

(54) SEMICONDUCTOR DEVICE AND GRINDING METHOD OF SEMICONDUCTOR DEVICE

(71) Applicants: Takeshi Kondo, Toyota (JP); Hideki Naruoka, Nagoya (JP); Hajime Tsukahara, Toyota (JP)

(72) Inventors: Takeshi Kondo, Toyota (JP); Hideki Naruoka, Nagoya (JP); Hajime Tsukahara, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/252,130

(22) Filed: Apr. 14, 2014

(65) Prior Publication Data

US 2014/0319671 A1    Oct. 30, 2014

(30) Foreign Application Priority Data

Apr. 26, 2013  (JP) ................. 2013-094063

(51) Int. Cl.
| | |
|---|---|
| H01L 23/36 | (2006.01) |
| B24B 7/22 | (2006.01) |
| H01L 23/00 | (2006.01) |
| H01L 23/433 | (2006.01) |
| H01L 23/488 | (2006.01) |
| B24B 37/013 | (2012.01) |
| B24B 37/04 | (2012.01) |

(52) U.S. Cl.
CPC .............. *B24B 7/228* (2013.01); *B24B 37/013* (2013.01); *B24B 37/042* (2013.01); *H01L 23/4334* (2013.01); *H01L 23/488* (2013.01); *H01L 24/33* (2013.01); *H01L 2224/48091* (2013.01); *H01L 2224/48247* (2013.01); *H01L 2224/73215* (2013.01); *H01L 2224/73265* (2013.01)

(58) Field of Classification Search
USPC ......... 257/276, 625, 675, 700–707, 712–722, 257/E33.075, E23.051, E23.08–E23.131; 438/122
See application file for complete search history.

(56) References Cited

U.S. PATENT DOCUMENTS 8,063,482 B2 * 11/2011 Lu .................................. 257/704

FOREIGN PATENT DOCUMENTS

| JP | 4-191458 | * 3/1992 | ............ 257/675 |
|---|---|---|---|
| JP | 2003-008078 A | 1/2003 | |
| JP | 2004-179185 A | 6/2004 | |
| JP | 2011-258814 A | 12/2011 | |
| JP | 2012-256651 A | 12/2012 | |

* cited by examiner

*Primary Examiner* — Jasmine Clark
(74) *Attorney, Agent, or Firm* — Dinsmore & Shohl LLP (57) ABSTRACT

A semiconductor device includes a semiconductor chip, and a grinding-processed layer laminated on one surface of the semiconductor chip. Further, the semiconductor device includes a sealing resin that seals the semiconductor chip and the grinding-processed layer; and a metal remaining-thickness checking portion provided adjacent to the grinding-processed layer, sealed by the sealing resin, and having a inclined plane that is inclined with respect to a laminating direction of the grinding-processed layer.

5 Claims, 10 Drawing Sheets

SEMICONDUCTOR DEVICE AND GRINDING METHOD OF SEMICONDUCTOR DEVICE

INCORPORATION BY REFERENCE

The disclosure of Japanese Patent Application No. 2013-094063 filed on Apr. 26, 2013 including the specification, drawings and abstract is incorporated herein by reference in its entirety.

BACKGROUND OF THE INVENTION

1. Field of the Invention

The present invention relates to a semiconductor device in which a semiconductor chip is sealed with resin, and a semiconductor device grinding method for failure analysis.

2. Description of Related Art

There is a semiconductor device in which a semiconductor chip such as a transistor or diode is sealed with resin, and in a case where the semiconductor chip is broken in such a semiconductor device, a broken part is observed and failure analysis is performed. A technique of the failure analysis includes, for example, an emission analytical method and an OBIRCH analytical method. In a case where the failure analysis is performed, it is necessary to remove an unnecessary part including the resin so as to expose an observation target part. The unnecessary part may include a solder layer that joins the semiconductor chip to a metal substrate, and a surface layer of the semiconductor chip itself, as well as the sealing resin.

As one method for removing an unnecessary part of a semiconductor device, there is such a technique that the unnecessary part is removed by etching, as described in Japanese Patent Application Publication No. 2004-179185 (JP 2004-179185 A), for example. In the technique described in JP 2004-179185 A, sealing resin and the like filled into a back side of a semiconductor chip is removed by etching.

SUMMARY OF THE INVENTION

As another method for removing an unnecessary part, there is a method using grinding. However, since a semiconductor chip is sealed with resin and cannot be observed from its outside, it is difficult to find how much more the grinding should be performed to expose a target section (a section of an inspection target). On the other hand, recent semiconductor substrates have such a tendency that each layer is formed thinner. On that account, if the grinding is performed too much, the target section may be also ground. In view of this, the related technology repeatedly performs a process in which grinding is performed little by little and a ground plane is observed so as to check whether or not the target section is exposed. This causes an increase of a cost. In view of this, a technique described herein provides a semiconductor device and a semiconductor device grinding method each of which is able to perform grinding up to a target section at a low cost, by reducing repetition of grinding and surface observation.

The technique disclosed herein relates to a semiconductor device including a semiconductor chip, a grinding-processed layer laminated on one surface of the semiconductor chip, and a sealing resin that seals the semiconductor chip and the grinding-processed layer. The grinding-processed layer is a general term of a portion that should be removed so as to expose a target section. The semiconductor device includes a metal remaining-thickness checking portion provided adjacent to the grinding-processed layer, sealed by the sealing resin, and having a inclined plane inclined with respect to a laminating direction of the grinding-processed layer. Note that a direction perpendicular to the laminating direction is referred to as a lamination-plane direction in the following description. The remaining-thickness checking portion is adjacent to a grinding-processed layering the lamination-plane direction.

According to such a configuration, when the grinding-processed layer is ground, boundary between the inclined plane and the sealing resin appear in a ground plane. For simplicity, the "boundary between the inclined plane and the sealing resin in the ground plane" may be referred to as "position of the inclined plane" in the following description. A shape of the remaining-thickness checking portion, including angle of the inclined plane, and a positional relationship between the remaining-thickness checking portion and the semiconductor chip have been known, so that it is possible to find a remaining thickness (a thickness that should be ground down to expose the target section) of the grinding-processed layer can be found from those positions of the inclined plane which appears in the ground plane. That is, even if the semiconductor chip is buried in the sealing resin and is not observable, it is possible to accurately estimate a depth (that is, a remaining thickness) to the target section of the semiconductor chip from a current ground plane based on position of the inclined plane which appears in the ground plane in the middle of grinding. Thus, it is possible to find out how much more the grinding should be performed. It is possible to remove more thickness by one grinding than the related technology, thereby making it possible to reduce a cost to expose the target section. Note that since the inclined plane of the remaining-thickness checking portion is made of metal, the position of the inclined plane clearly appears in the ground plane as minute straight lines at the time of grinding the remaining-thickness checking portion in the laminating direction. This makes it possible to find the remaining thickness accurately in a submicron unit based on the boundary thus appearing clearly. Accordingly, it is possible to reach the target section with further less repetition.

By combining the semiconductor device described above with steps before the target section is exposed, it is possible to embody the technique disclosed herein in the following method. The method is a method for grinding a semiconductor device including a grinding-processed layer laminated on one surface of a semiconductor chip. The method uses the aforementioned semiconductor device, and includes grinding the grinding-processed layer and the remaining-thickness checking portion at the same time along the laminating direction; and calculating a remaining thickness of the grinding-processed layer in the laminating direction based on a relationship between position of the inclined plane which appears in a ground plane of the remaining-thickness checking portion and inclination angle of the inclined plane.

Note that as a technique similar to the configuration of the present application, JP 2004-179185 A describes figures in which inclined planes seem to be formed around a semiconductor chip (see FIGS. 1, 3, etc.). However, the figures in JP 2004-179185 A just show that there is a gap between the semiconductor chip and resin that seals this, and does not intend to provide inclined planes around the semiconductor chip. That is, the figures in JP 2004-179185 A show that a gap exists between the semiconductor chip and the resin that seals this, and this results in that the figures accidentally resemble the inclined planes of the present application. Further, even if it is understood that JP 2004-179185 A describes that inclined planes are provided around the semiconductor chip, the inclined planes in JP 2004-179185 A are made of resin, and boundaries that appear in a ground plane are inferior in accuracy to the boundaries of the metal inclined planes in the present application in a microscopic viewpoint. That is, the resin has a rough surface as compared to the metal, so that a boundary between resin and resin does not form a minute straight line, thereby making it extremely difficult to check a remaining thickness in an order of submicron, which is achieved in the present application. Further, a configuration similar to the configuration of JP 2004-179185 A is described in Japanese Patent Application Publication No. 2012-256651 (JP 2012-256651 A), but similarly to JP 2004-179185 A, inclined planes are made of not metal, but resin, so that it is difficult to accurately grasp boundaries of the inclined planes. Note that the technique described in JP 2012-256651 A relates to a semiconductor light emitting device, in which a light-emitting element is covered with transparent resin corresponding to a lens and the transparent resin is surrounded by a tapered tubular wall including an inner surface having a high reflectance. The tapered tubular wall, so to speak, functions as a reflecting mirror of light. Thus, the technique of JP 2012-256651 A relates to a semiconductor device, but it has nothing to do with the technique related to failure analysis, unlike the present application.

Further, in the technique described herein, the semiconductor device may have the following structure. The semiconductor chip is fixed to a metal plate via a solder layer, and the grinding-processed layer includes the solder layer. Further, the remaining-thickness checking portion is a wall provided adjacent to the solder layer so as to stand from the metal plate. Further, the wall surrounds the semiconductor chip when the semiconductor chip is viewed in a plane manner. The metal plate is typically a heat sink releasing heat of the semiconductor chip, or a lead frame. From a different viewpoint, a mounting range of the semiconductor chip surrounded by the wall of the metal plate can be regarded as a "hollow provided in the metal plate." In that case, the inclined plane of the remaining-thickness checking portion corresponds to side surfaces of the hollow.

Further, in the technique described herein, each of the inclined planes opposed to at least two sides of the semiconductor chip when viewed in a plane manner may be provided with a groove or a ridge extending along an inclination direction of the each of the inclined planes. Further, the groove extending along the inclination direction of the each of the inclined planes may have a triangular shape. Further, a plurality of grooves extending along the inclination direction of the each of the inclined planes may be provided. Further, the groove extending along the inclination direction of the each of the inclined planes may include a plurality of inclination angles. Further, the grinding method using such a semiconductor chip determines evenness of a remaining thickness of the grinding-processed layer based on those positions of the grooves or ridges which appear in the ground plane of the remaining-thickness checking portion. Here, the evenness of the remaining thickness indicates an inclination of a current ground plane with respect to the target section.

According to such a configuration, it is possible to accurately determine the evenness of the remaining thickness of the grinding-processed layer based on the grooves or ridges formed on the metal inclined planes. For example, if a remaining thickness in an inclined plane opposed to one side of the semiconductor chip is different from a remaining thickness in an inclined plane opposed to another side thereof, it is possible to find that the ground plane is inclined with respect to the target section of the semiconductor chip. Further, when the metal plate is fixed by the solder layer, the inclined planes provided adjacent to the semiconductor chip is able to dam up a flow of the solder layer, thereby making it possible to obtain a high-quality semiconductor device. Further, when the groove extending along the inclination direction of the inclined plane has a triangular shape, it is possible to accurately draw virtual lines based on vertices of triangles, thereby making it possible to find the evenness of the remaining thickness accurately. Further, in a case where a plurality of grooves extending along the inclination direction of the inclined plane are provided, even if the semiconductor device has a large area, it is possible to determine evenness of grinding based on positions of adjacent grooves. Further, when the groove extending along the inclination direction of the inclined plane includes a plurality of inclination angles, it is possible to adjust a degree of external expansion of the inclined plane that appears in the ground plane as the grinding proceeds, thereby making it possible to check the remaining thickness more accurately.

Further, the inclined planes may extend from a surface of the metal plate so as to reach a height corresponding to a plane to be exposed (the aforementioned target section) in the semiconductor chip. Here, it should be noted that the "height corresponding to the plane to be exposed in the semiconductor chip" does not exclude such a case where the inclined planes extend beyond the height corresponding to the plane to be exposed in the semiconductor chip. That is, the inclined planes may at least "extend so as to reach the height corresponding to the plane to be exposed in the semiconductor chip."

Technical details and described in the present specification and further improvements thereof are described in the following embodiments.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
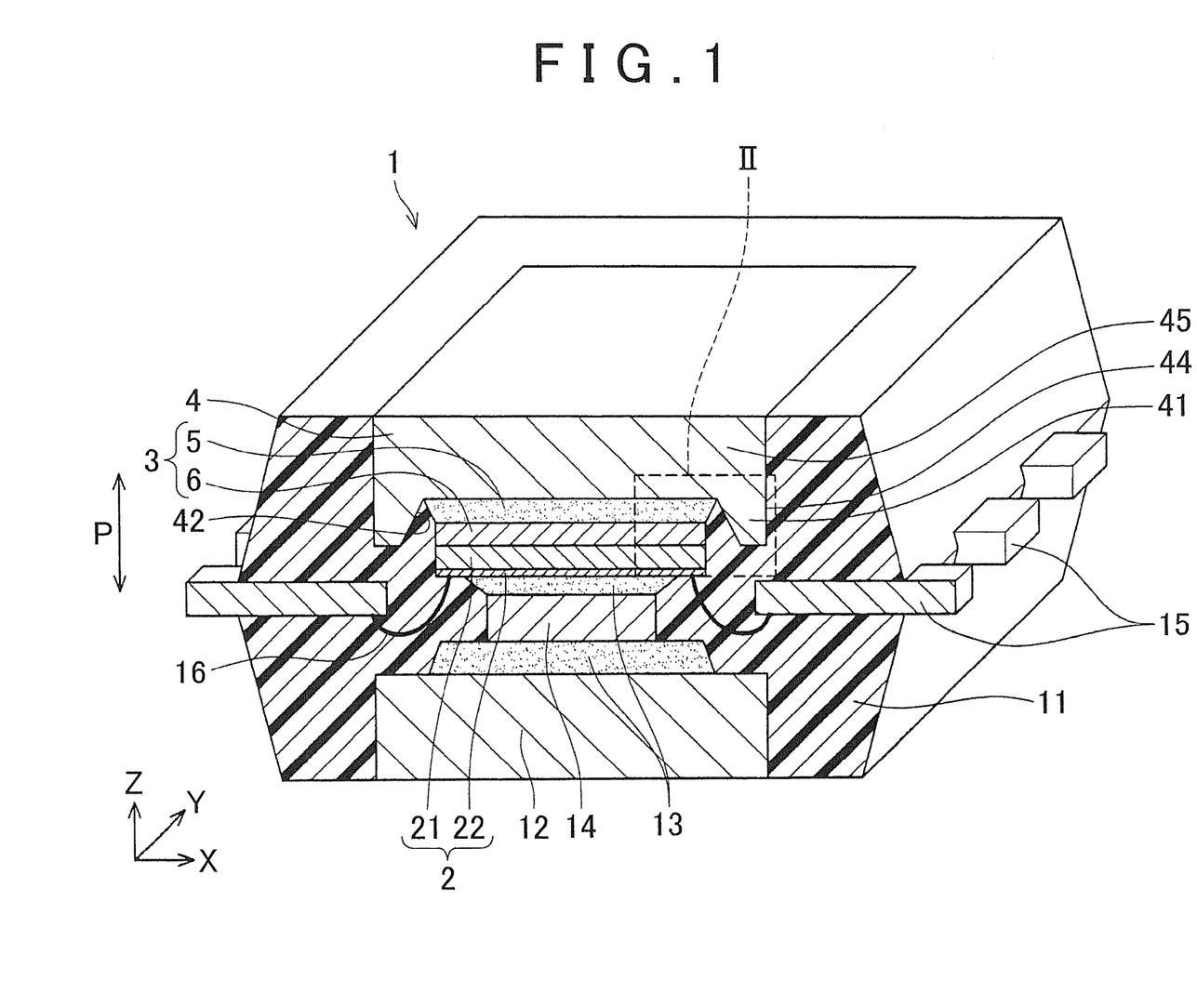
FIG. 1 is a perspective view illustrating a partial section of a semiconductor device according to an embodiment.

The following will describe embodiments with reference to the attached drawings. FIG. 1 is a perspective view illustrating a partial section of a semiconductor device 1. The semiconductor device 1 is a device in which a semiconductor chip 2, which is a transistor, is sealed with a sealing resin 11. When a defect occurs in the semiconductor chip 2, in order to find its cause, the semiconductor chip 2 thus sealed is exposed, so as to observe a specific section thereof by a microscope (an emission microscope) and to inspect electric characteristics of the specific section. In view of this, it is necessary to expose a target section of the semiconductor chip 2 by grinding the semiconductor device 1 together with the sealing resin 11. Since the semiconductor chip is entirely buried in the sealing resin, the related technology is performed in such a manner that, in order not to grind the target section, grinding is performed little by little and a ground plane is accordingly observed to check whether or not a target section is exposed. The semiconductor device 1 of the present embodiment has such a special stricture that a remaining thickness (a grinding thickness necessary to expose the target section) of the device can be estimated in the middle of grinding. Since the remaining thickness can be estimated, it is possible to reduce the number of repetitions of a step of performing grinding and checking whether or not the target section is exposed.

A structure of the semiconductor device 1 is described below. Herein, for the convenience of the description, an upper surface of a tabular semiconductor chip 2 in FIG. 1 is referred to as "a back surface" and a lower surface thereof in the figure is referred to as a front surface.

The semiconductor device 1 includes a semiconductor chip 2 including a semiconductor substrate 21 and a wiring pattern 22, and a back-surface electrode 6, a back-side solder layer 5, and a back-side heat sink 4 laminated on a back side of the semiconductor chip 2. Further, the semiconductor device 1 includes a front-side solder layer 13, a spacer 14, and a front-side heat sink 12 laminated on a front side of the semiconductor chip 2. These constituents are laminated along a laminating direction P, and are entirely sealed with the sealing resin 11 between two heat sinks 4, 12. Note that a thickness of the back-surface electrode 6 is around several microns, while a thickness of each of the solder layers 5, 13 is around 100 microns, but in the figure, these thicknesses are illustrated in a deformed manner so as to help understanding of the structure.

The semiconductor chip 2 is a transistor as previously described. A body layer, a drift layer, a buffer layer, and the like are formed on the tabular semiconductor substrate 21 of SiC (silicon carbide), a wiring pattern 22 is formed on a front side thereof, and the back-surface electrode 6 is laminated on a back surface thereof. The front side of the substrate 21 is a side which corresponds to an emitter and on which a gate is formed, and the gate is connected to a gate electrode 15 via a bonding wire 16. A surface of the wiring pattern 22 corresponds to an emitter, and a metal spacer 14 is joined thereto via the front-side solder layer 13. Further, the front-side heat sink 12 is joined to the spacer 14 via the front-side solder layer 13. The front-side solder layer 13, the spacer 14, and the front-side heat sink 12 are electrically conductive. The front-side heat sink 12 is a component that diffuses heat of the semiconductor chip 2, and functions as one electrode (an emitter electrode) of the semiconductor device 1. The spacer 14 is inserted for the purpose of securing a thickness of the semiconductor device 1.

In the meantime, on the back side of the semiconductor chip 2, the back-surface electrode 6 is joined to the back-side heat sink 4 via the back-side solder layer 5. The back-side heat sink 4 is electrically conductive, is a component that diffuses heat of the semiconductor chip 2, and functions as another electrode (a collector electrode of a transistor) of the semiconductor device 1.

The two heat sinks 12, 4 and the spacer 14 are made of metal, and typically made of copper or aluminum that is excellent in electric conductivity and heat conductivity. Note that a reference sign P shown in FIG. 1 indicates a laminating direction of the semiconductor chip 2 and the heat sinks 4, 12. The laminating direction P corresponds to a Z-axis direction in coordinates in the figure.

In the semiconductor device 1, the semiconductor chip 2, as well as the back-surface electrode 6 and the spacer 14, is sealed with the sealing resin 11 between the two heat sinks 4, 12. Accordingly, the semiconductor chip 2 usually cannot be observed from its outside. As described above, when the semiconductor device 1 is broken, a predetermined section of the semiconductor chip 2 is exposed so as to be inspected. In a case of the semiconductor chip 2, which is a transistor, a surface on a collector side is exposed to be inspected in most cases. Accordingly, it is necessary to remove the back-side heat sink 4, the back-side solder layer, 5 and the back-surface electrode 6 together with the sealing resin 11. In the semiconductor device 1 described in the present invention, those layers are removed by grinding. In view of this, in the present embodiment, the back-surface electrode 6 making direct contact with the back surface of the semiconductor chip 2, and the back-side solder layer 5 making contact with the back-surface electrode 6 may be generally referred to as a "grinding-processed layer 3" for the convenience of the description. Note that part of the back-side heat sink 4 and the sealing resin 11 also corresponds to the "grinding-processed layer," but it should be noted that the back-surface electrode 6 and the back-side solder layer 5 that are laminated in that intended section of the semiconductor chip 2 which is to be exposed are referred to as the grinding-processed layer 3 in particular for the convenience of the description. Further, "the intended section that is to be exposed" corresponds to the "target section" described above. In the following description, the target section may be referred to as a "plane to be exposed." The following describes a structure to estimate a thickness (a remaining thickness) that should be removed from the ground plane to the plane to be exposed in the middle of grinding.

The semiconductor device 1 is configured such that the back-side heat sink 4 has a structure to estimate (check) the remaining thickness. The back-side heat sink 4 includes a peripheral wall 41 that surrounds the semiconductor chip 2 when viewed in a plane manner, and a structure of the peripheral wall 41 is used to check the remaining thickness. Note that, in the following description, a plate-like portion of the back-side heat sink 4 other than the peripheral wall 41 may be referred to as a base portion 45.

Those surfaces of the peripheral wall 41 which face the semiconductor chip 2 are inclined with respect to the laminating direction P, and surfaces thereof on sides opposite to the semiconductor chip 2 are parallel to the laminating direction P. The surfaces that face the semiconductor chip 2 are referred to as inclined planes 42, and the surfaces on the sides opposite to the semiconductor chip 2 are referred to as end surfaces 44. The end surfaces 44 are parallel to the laminating direction P. When the back side of the semiconductor device 1 is ground, those positions of the end surfaces 44 which are exposed to the ground plane is immovable, but those positions of the inclined planes 42 change according to a thickness that is ground down. Note that the positions of the end surfaces 44 indicate boundaries between the end surfaces 44 appearing in the ground plane and the sealing resin 11. Similarly, the positions of the inclined planes 42 indicate boundaries between the inclined planes 42 appearing in the ground plane and the sealing resin 11. Angles of the inclined planes 42 with respect to the laminating direction P and positional relationships between the inclined planes 42 and the semiconductor chip 2 have been known, so that a relationship between the ground plane and the semiconductor chip 2 can be found from those relationships and those positions of the inclined planes 42 which appear in the ground plane. That is, it is possible to grasp how much thickness should be ground down more before the target section is exposed. A thickness from a current ground plane to the target section corresponds to the remaining thickness. Next will be described a mechanism to estimate the remaining thickness.

Figure 2:
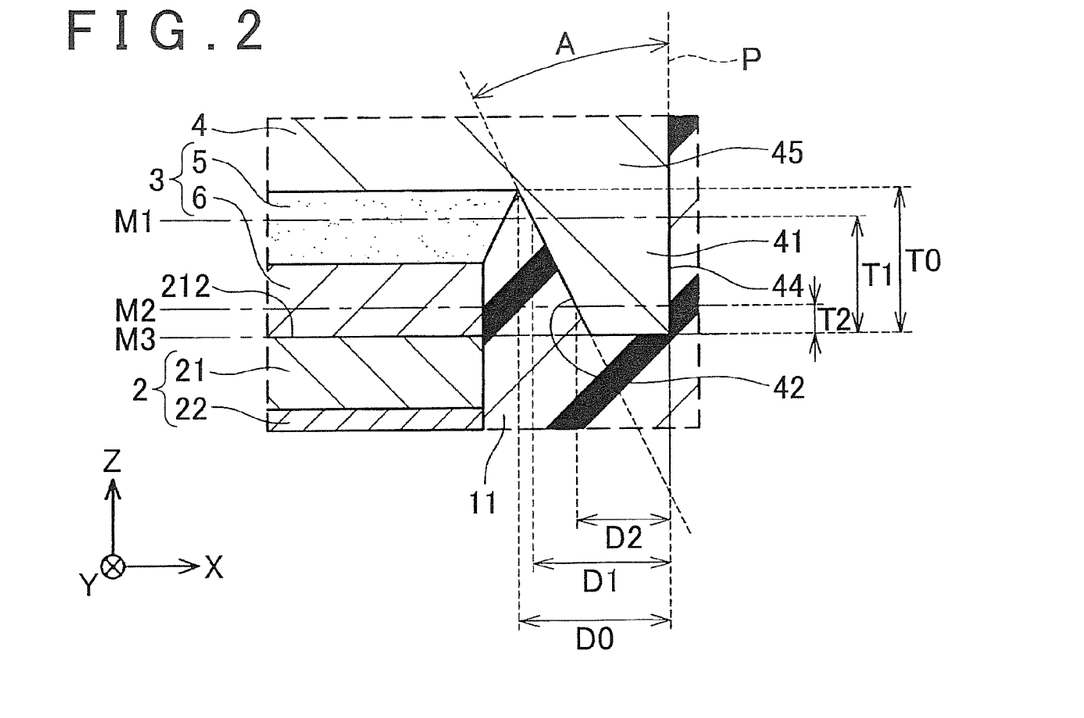
FIG. 2 is an expanded sectional view of a region shown by a broken line II in FIG. 1.

FIG. 2 is an enlarged view of a broken line region shown by a reference sign II in FIG. 1. In the present embodiment, an intended section to be exposed (the plane to be exposed) for failure analysis is assumed a back surface 212 of the semiconductor chip 2 (a joining surface to the back-surface electrode 6). In order to expose the back surface 212, the backside heat sink 4 and the grinding-processed layer 3 are ground. In the semiconductor device 1, in the middle of grinding, it is possible to estimate a residual thickness (a remaining thickness) that should be ground down to the back surface 212, by use of the inclined planes 42 of the peripheral wall 41. Now, a plane M3 including the back surface 212 corresponds to the plane to be exposed.

The inclined plane 42 is inclined at an angle A with respect to the laminating direction P. The angle A has been known. Further, in the section in FIG. 2, a distance D0 from an intersection between the base portion 45 and the inclined plane 42 in the back-side heat sink 4 to the end surface 44, and a height T0 from the base portion 45 to the plane M3 to be exposed have been also known. Note that, in the present embodiment, a height from the base portion 45 to the inclined plane 42 is equal to the height T0 from the base portion 45 to the plane M3 to be exposed. The other reference signs in FIG. 2 are as follows. Reference signs M1 and the M2 indicate ground planes in the middle of grinding. A reference sign D1 indicates a distance between the position of the end surface 44 and the position of the inclined plane 42, both exposed in the ground plane M1 when grinding is performed up to the ground plane M1. A reference sign T1 indicates a distance from the plane M3 to be exposed to the ground plane M1, namely, a remaining thickness at the ground plane M1. A reference sign D2 indicates a distance between the position of the end surface 44 and the position of the inclined plane 42, both exposed in the ground plane M2 when grinding is performed up to the ground plane M2. A reference sign T2 indicates a distance from the plane M3 to be exposed to the ground plane M2, namely, a remaining thickness at the ground plane M2. With the use of the reference signs, a relationship of $(D0-D1)/(T0-T1)=(D0-D2)/(T0-T2)=\tan A$ is established. The angle A, the distance D0, and the height T0 are values determined on the design of the semiconductor device, and therefore, they have been already known. The distance D1 (or D2) is a distance between the position of the end surface 44 and the position of the inclined plane 42, both exposed in the middle of the grinding, so that they can be measured on the ground plane. From the above relationship, if the distance D1 (or D2) on the ground plane is measured, it is possible to find the remaining thickness T1 (or T2) by calculation. As such, since the semiconductor device 1 in which the semiconductor chip 2 is completely covered with the sealing resin 11 includes the inclined planes 42 placed on sides of the semiconductor chip 2 (sides in the plane view), it is possible to estimate a remaining thickness up to the plane to be exposed.

Figure 3:
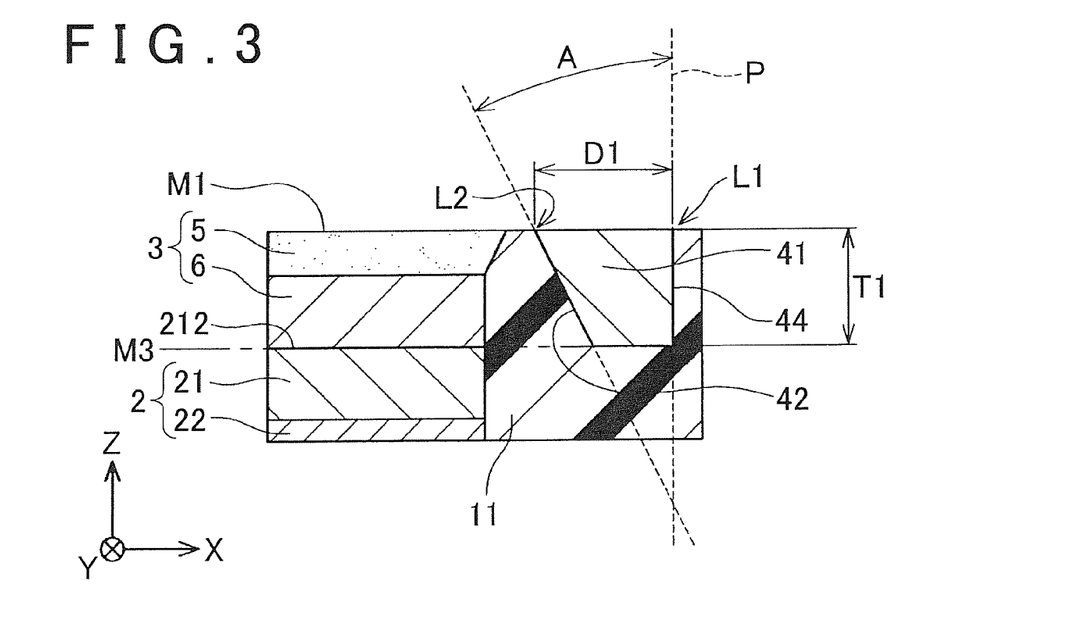
FIG. 3 is an enlarged view corresponding to FIG. 2 at the time when a ground plane M1 is exposed.
Figure 4:
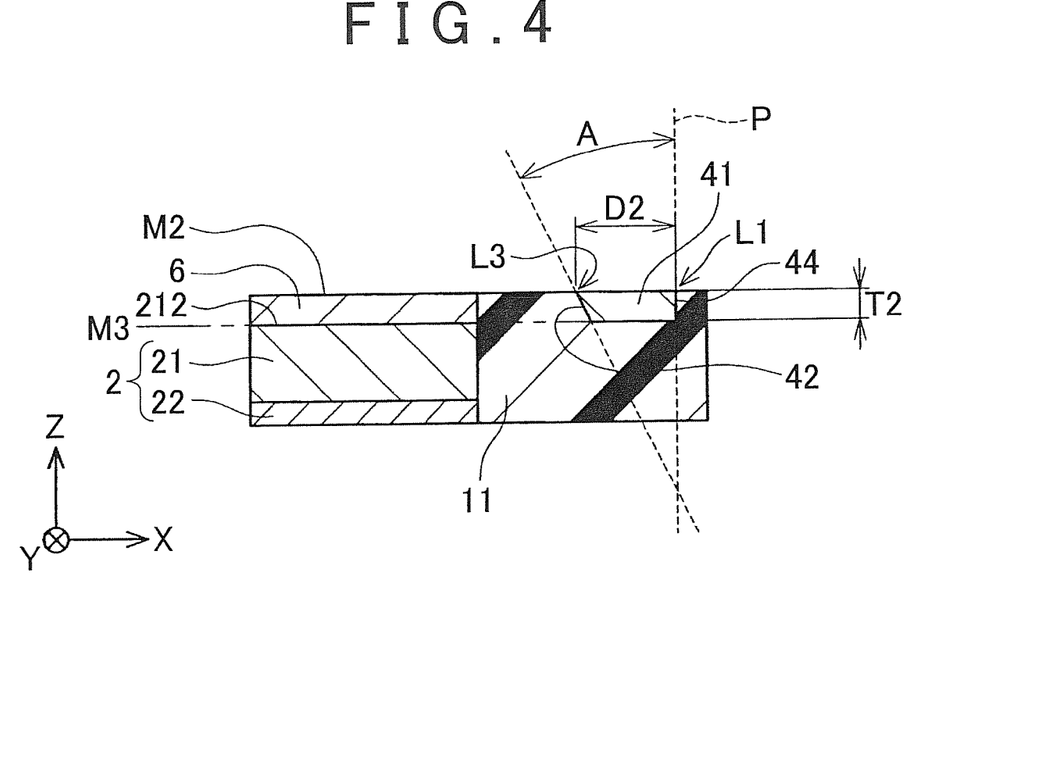
FIG. 4 is an enlarged view corresponding to FIG. 2 at the time when a ground plane M2 is exposed.
Figure 5:
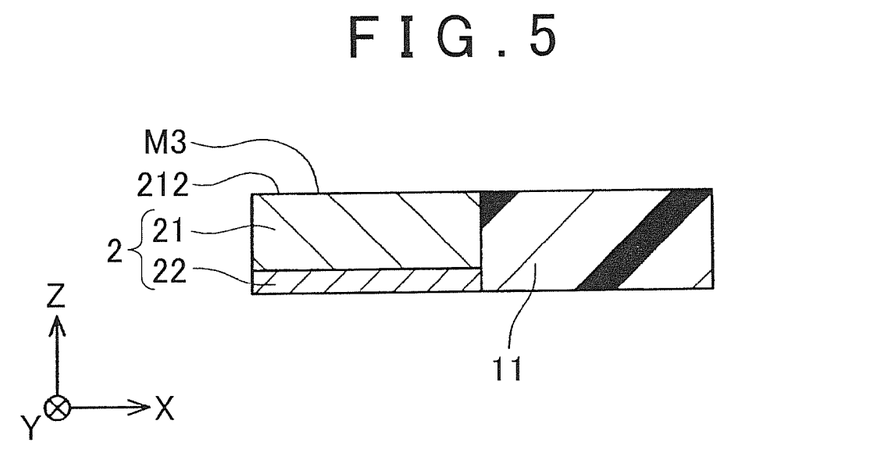
FIG. 5 is an enlarged view corresponding to FIG. 2 at the time when a back surface of a substrate is exposed.

In actual grinding, a step (a grinding step) of grinding, and a step (a calculation step) of calculating, based on the position of the inclined plane 42, a remaining thickness from the current ground plane to the plane M3 to be exposed are performed several times, so as to expose the target section with high accuracy. However, the number of repetitions is much less than the method of the related technology in which whether or not a target section is exposed is checked every time grinding is performed. For example, FIG. 3 is a view corresponding to FIG. 2, and is an expanded sectional view when grinding is performed up to the ground plane M1. When the ground plane M1 is exposed, a position L1 of the end surface 44 of the peripheral wall 41 and a position L2 of the inclined plane 42 are exposed, so that the distance D1 is found by measuring these positions. From the aforementioned relational expression, the remaining thickness T1 from the ground plane M1 to the plane M3 to be exposed is found according to $T1=T0-(D0-D1)\cdot\arctan A$ (the calculation step). Subsequently, in the grinding step, the grinding is performed on a thickness that is estimated to be slightly smaller than the remaining thickness T1. Then, a remaining thickness is estimated again. For example, FIG. 4 is a view corresponding to FIG. 2, and is an expanded sectional view when grinding is performed up to the ground plane M2 that is deeper than the ground plane M1. When the ground plane M2 is exposed, the position L1 of the end surface 44 of the peripheral wall 41 and a position L3 of the inclined plane 42 are exposed, so that the distance D2 is found by measuring these positions. From the aforementioned relational expression, the remaining thickness T2 from the ground plane M2 to the plane M3 to be exposed is found according to $T2=T0-(D0-D2)\cdot\arctan A$ (the calculation step). Thus, the grinding step and the calculation step are repeated several times to perform grinding up to a position where a grinding thickness is controlled with high accuracy, and then, the remaining thickness finally calculated is ground down at once, so as to expose the plane M3 to be exposed (that is, the back surface 212) (see FIG. 5). Here, if the remaining thickness is estimated relatively accurately, the "thickness that is estimated to be slightly smaller than the remaining thickness" has a thickness close to the remaining thickness. That is, it is possible to reduce a larger thickness by one grinding, thereby making it possible to reduce a cost for the grinding.

Note that a thickness of the back-surface electrode 6 or a thickness of a layer provided on a semiconductor chip, such as a drift layer and a buffer layer, becomes thinner and thinner every year. On this account, an allowable width of an exposed surface in a thickness direction of the semiconductor chip 2 which exposed surface is really exposed on an intended section may be in the order of submicron. Since the inclined plane 42 is one surface of the metal peripheral wall 41, its surface roughness is extremely small as compared to the sealing resin 11. Hence, that boundary of the inclined plane 42 (that is, the position of the inclined plane) which is exposed in the ground plane appears as a minute straight line. Accordingly, it is possible to accurately measure the position of the inclined plane 42 in the ground plane. Since measuring accuracy of the position of the inclined plane 42 is directly related to accuracy of the remaining thickness, the semiconductor device 1 using the metal inclined plane 42 is able to estimate the remaining thickness with extremely high accuracy.

As apparent from the technique of estimating a remaining thickness, it is preferable that the peripheral wall 41 extend along the laminating direction P from a surface of the base portion 45 of the back-side heat sink 4 to at least a position corresponding to the plane to be exposed of the semiconductor chip 2. As illustrated in FIG. 2, in the semiconductor device 1 of the present embodiment, the plane to be exposed (the back surface 212) and one end of the inclined plane 42 have the same height T0 from the surface of the base portion 45.

Further, in a case where a resolution (a minimum length that can be measured) of a measuring apparatus that measures that position of the inclined plane 42 (or the position of the end surface 44) which is exposed in the ground plane is X [micron], and a necessary resolution (a minimum length) in a width direction for estimation of the remaining thickness is Y [micron], it is necessary for the angle A to be A>arctan(X/Y). For example, in a case where the resolution of the measuring apparatus that measures the position of the inclined plane is 0.1 [micron] and a desirable resolution for estimation of the remaining thickness is 0.1 [micron], the angle A is A>arctan (X/Y)=45 [deg].

Figure 6:
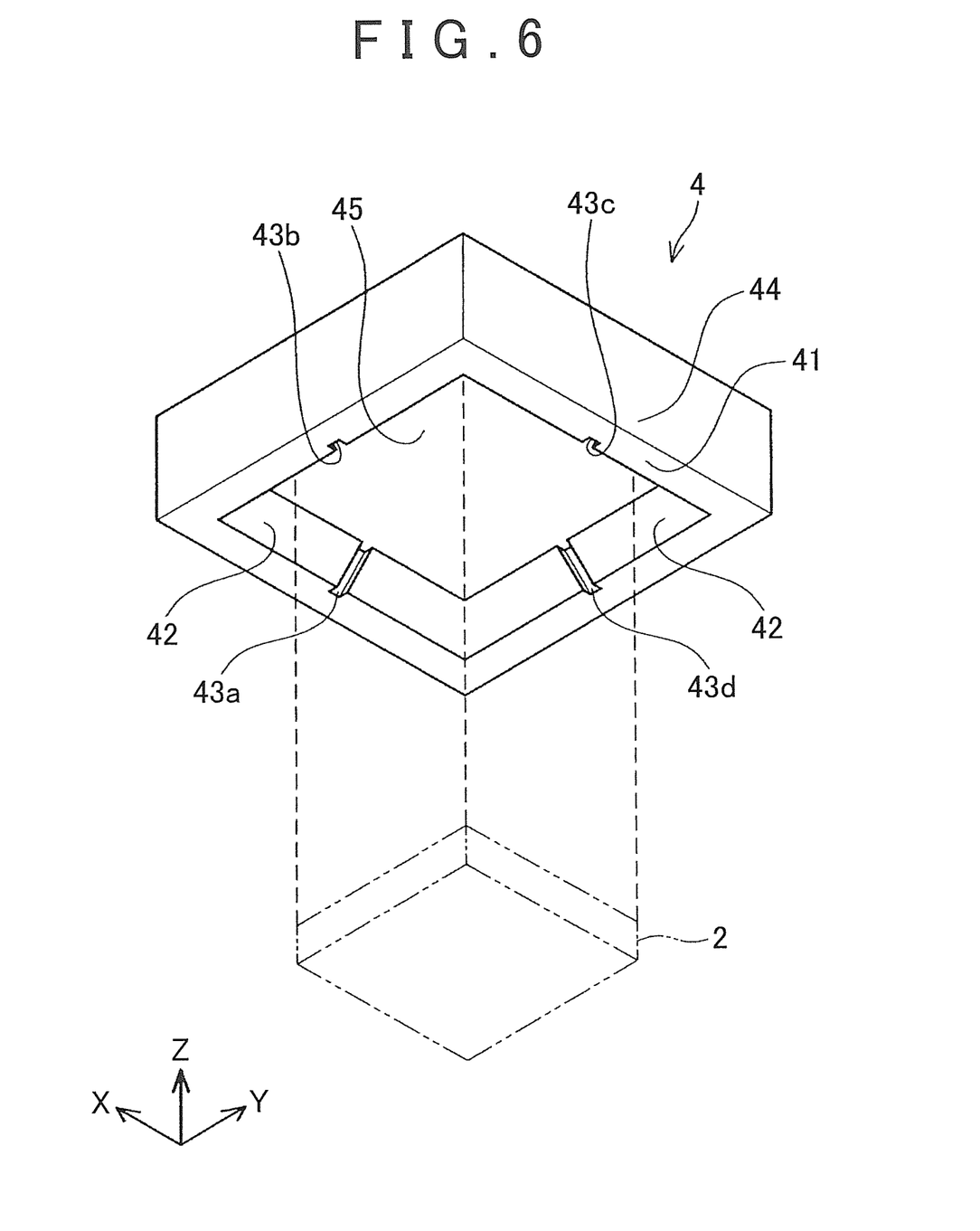
FIG. 6 is a perspective view of a back-side heat sink.
Figure 7:
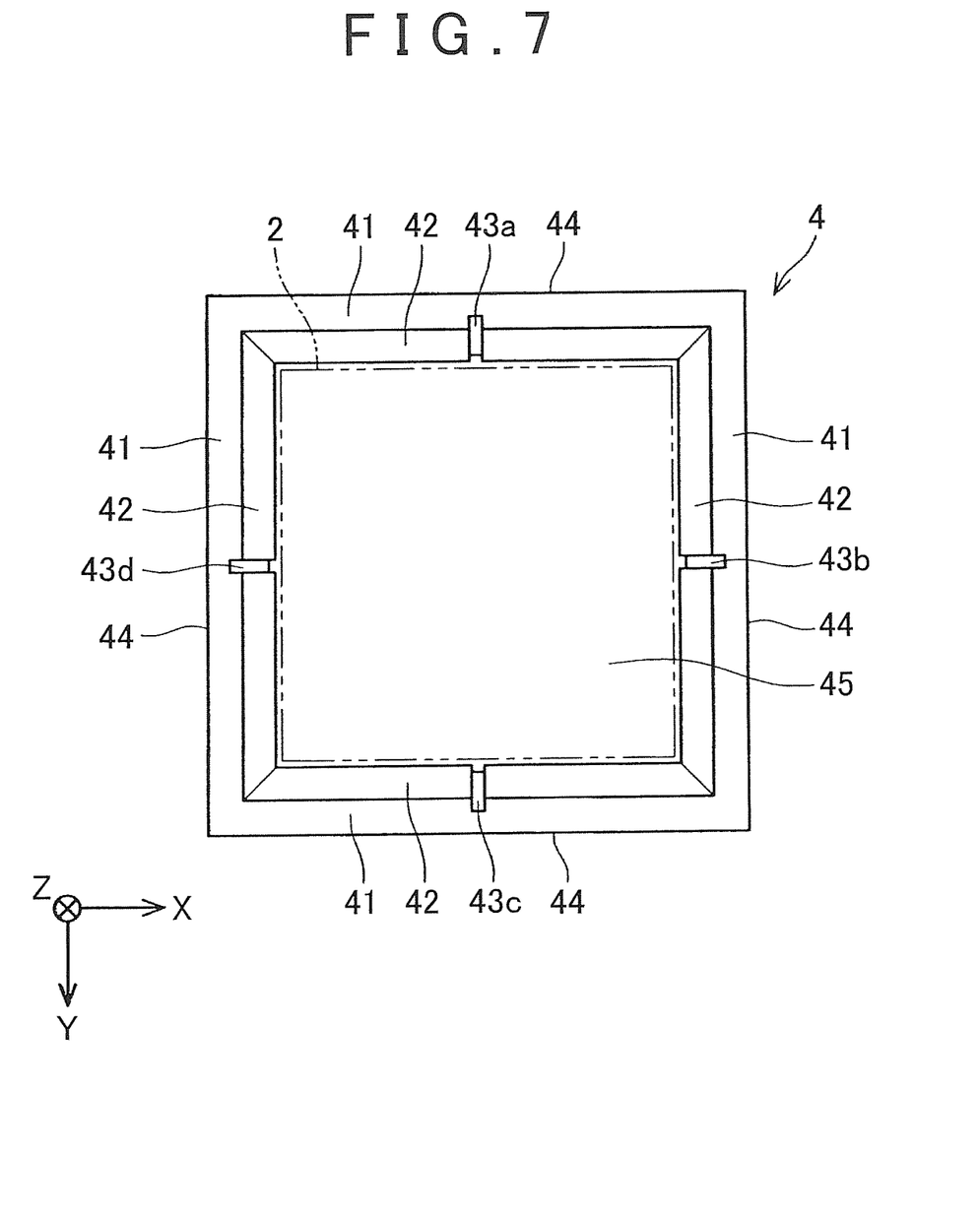
FIG. 7 is a bottom view of the back-side heat sink.

Next will be described a three-dimensional shape of the back-side heat sink 4 and a function thereof. FIG. 6 is a perspective view of the back-side heat sink 4, and FIG. 7 is a bottom view of the back-side heat sink 4. In FIGS. 6, 7, the semiconductor chip 2 is drawn by a virtual line for reference, but the back-side solder layer 5 and the back-surface electrode 6 sandwiched between the semiconductor chip 2 and the back-side heat sink 4 are not illustrated. The back-side heat sink 4 includes the peripheral wall 41 provided so as to surround the semiconductor chip 2 when viewed in a plane manner (from a point of view in the Z-axis direction in the figure). As described above, that inclined plane 42 of the peripheral wall 41 which faces the semiconductor chip 2 is inclined with respect to the laminating direction (in the Z-axis direction in the figure). As apparent from FIG. 6, a region surrounded by the peripheral wall 41 is a hollow that accommodates the semiconductor chip 2 therein, if it is expressed in another way.

Further, as illustrated in FIG. 7 well, the semiconductor chip 2 is rectangular in a plane view, and the peripheral wall 41 is also rectangular. Four sides of the rectangular shape formed by the inclined planes 42 of the peripheral wall 41 are respectively provided with grooves 43a to 43d extending in respective inclination directions (the laminating direction). The grooves 43a to 43d extend from the base portion 45 of the peripheral wall 41 to a top face in a height direction. In other words, the inclined planes 42 are respectively provided with the grooves 43a to 43d so as to be respectively opposed to four sides of the rectangular semiconductor chip 2 in a plane view. Particularly, each of the grooves 43a to 43d is provided in a middle point of each of inner sides of the rectangular shape of the peripheral wall 41 in a plane view.

Figure 8:
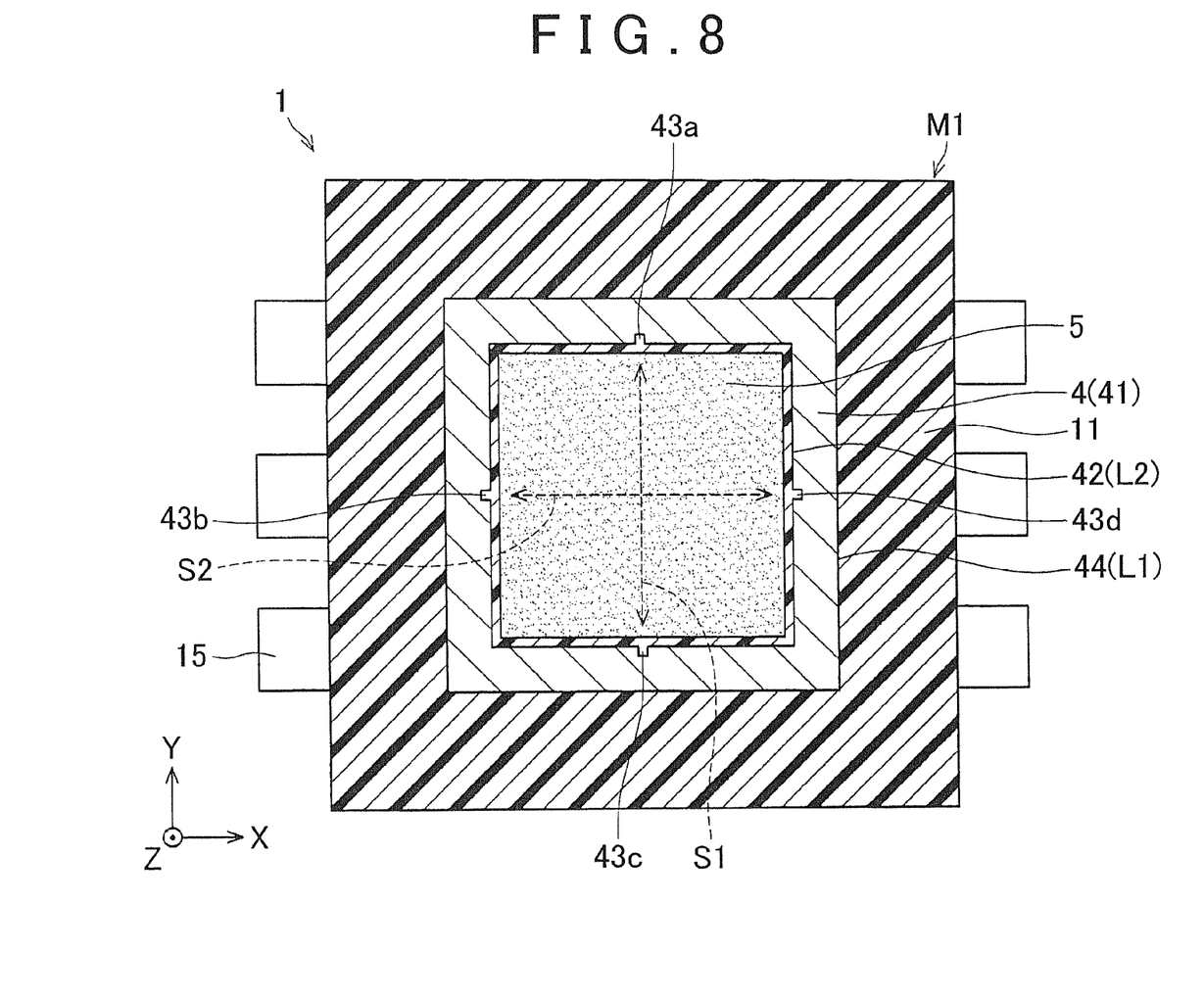
FIG. 8 is a plane view of the semiconductor device at the time when the ground plane M1 is exposed.

The grooves 43a to 43d are used to specify the positions of the inclined planes 42 at the time of estimating a remaining thickness. Further, by estimating remaining thicknesses at respective positions of the grooves 43a to 43d provided at four places, it is possible to check whether or not the ground plane is inclined with respect to the plane to be exposed. This will described with reference to FIG. 8. FIG. 8 is a plane view of the semiconductor device 1 at the ground plane M1, which has been described in FIG. 3. Note that FIG. 8 illustrates a surface exposed when the grinding is performed up to the ground plane M1, but the surface is a section originally, so that hatching indicating the section is illustrated. Further, in the plane view of FIG. 8, a rectangular line for the end surfaces 44 of the peripheral wall 41 indicates the positions L1 of the end surfaces 44, and a rectangular line for the inclined planes 42 indicates the positions L2 of the inclined planes 42 (see the sectional view of FIG. 3 in which the reference sings L1 and L2 are also shown). As illustrated in FIG. 8, the positions of the grooves 43a to 43d provided at four places are specified in the ground plane M1. In each of the four places of the grooves 43a to 43d, the position L1 of the end surface 44 and the position L2 of the inclined plane 42 are measured, and a remaining thickness is calculated from a distance D1 therebetween. From the remaining thicknesses at the four places, an inclination of the ground plane M1 with respect to the plane to be exposed can be estimated.

It is also possible to simplify the inclination of the ground plane M1 with respect to the plane to be exposed, by the following process. As illustrated in FIG. 8, virtual lines S1, S2 each connecting opposed grooves to each other are drawn with respect to the positions of the grooves 43a to 43d at four places. The virtual lines S1, S2 intersect with each other. Then, the paired virtual lines S1, S2 thus drawn are observed, and when the virtual lines S1, S2 intersect with each other at their centers, the ground plane is parallel to the plane to be exposed. On the other hand, when the paired virtual lines S1, S2 intersect with each other not at their centers, but at portions deviating from their centers, the ground plane is inclined with respect to the plane to be exposed. In this case, the subsequent grinding step is performed so that the grinding is modified so as to correct the inclination. Thus, with the use of the grooves 43a to 43d at four places, it is possible to estimate whether or not the ground plane is inclined with respect to the plane to be exposed. In other words, the above process can be referred to as a process of "determining evenness of the remaining thickness of the grinding-processed layer 3."

Note that it is natural that a width (or depth) of a groove that appears in the ground plane should be larger than the resolution (a minimum length that can be measured) of the apparatus that measures the groove.

The following describes a point to keep in mind in regard to the technique described in the above embodiment. The peripheral wall 41 including the inclined planes 42 provides a mechanism to estimate a remaining thickness at the time of grinding. The peripheral wall 41 corresponds to an example of a remaining-thickness checking portion.

The following describes advantages of the semiconductor device 1 and its grinding method as described above. According to the above configuration, since the inclined plane 42 of the remaining-thickness checking portion (the peripheral wall 41) of the semiconductor device 1 is made of metal, when the remaining-thickness checking portion (the peripheral wall 41) is ground in the laminating direction P, the position of the inclined plane 42 (the intersecting position between inclined plane 42 and the ground plane) appears clearly as a minute straight line in the ground plane. Hereby, when a remaining thickness of the grinding-processed layer 3 is found based on a relationship between those positions of inclined planes 42 which appear in the ground plane and the inclination angles thereof, a reference is clear, so that it is possible to find the remaining thickness accurately. Further, it is also possible to accurately determine the evenness of the remaining thickness of the grinding-processed layer 3 based on the grooves 43 formed on the metal inclined planes 42.

Further, as illustrated in FIG. 2 well, the peripheral wall 41 is provided to stand adjacent to the semiconductor chip 2 and the back-surface electrode 6 in a lamination-plane direction. In view of this, when the base portion 45 (a metal plate) of the back-side heat sink 4 is fixed by the back-side solder layer 5, it is possible to dam up a flow of the back-side solder layer 5 by the peripheral wall 41 (the remaining-thickness checking portion), thereby making it possible to obtain a high-quality semiconductor device 1.

Further, the grinding method is particularly effective for a semiconductor device in which a layer to be formed on a semiconductor substrate is thin like a SiC substrate, that is, a layer including a target section is thin, and a deviation of an allowable grinding thickness to expose the target section is small.

Figure 9:
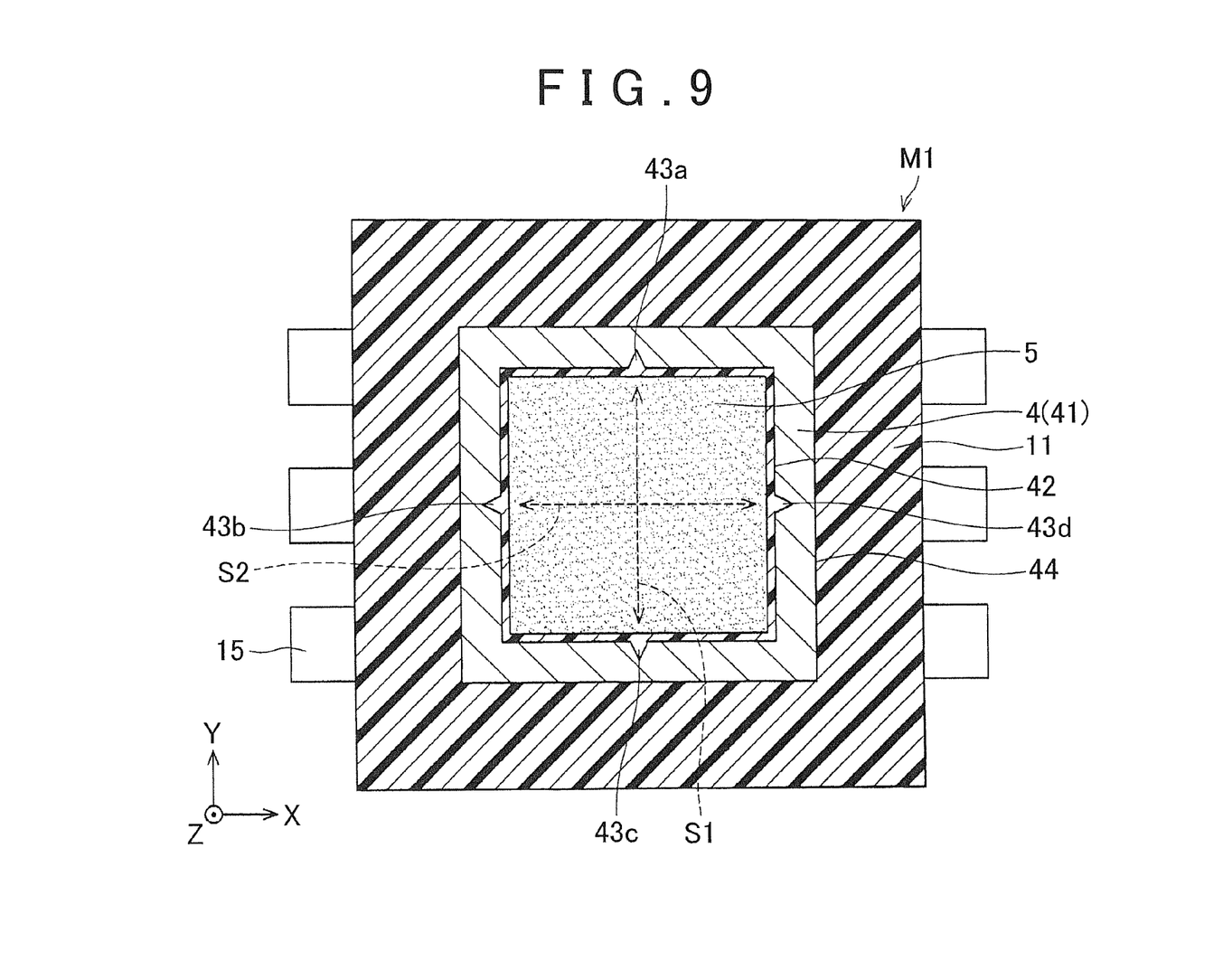
FIG. 9 is a plane view of a semiconductor device according to another embodiment at the time when a ground plane M1 is exposed.

One embodiment has been described above, but a specific aspect is not limited to the above embodiment. For example, in the above embodiment, the grooves 43*a* to *d* are formed so as to appear in a quadrangular shape on the ground plane, but the shape of the grooves 43 is not limited in particular, and may be formed so as to appear in a triangular shape on the ground plane, as illustrated in FIG. 9. In a case where the grooves 43*a* to *d* have a triangular shape, it is possible to accurately draw the virtual lines S1, S2 based on vertices of the triangles, thereby making it possible to find the evenness of the remaining thickness accurately. Note that FIG. 9 is a view corresponding to FIG. 8, and is a plane view of a semiconductor device at the time when a ground plane M1 is exposed. However, the ground plane M1 is a section originally, so that hatching indicating the section is illustrated in FIG. 9.

Figure 10:
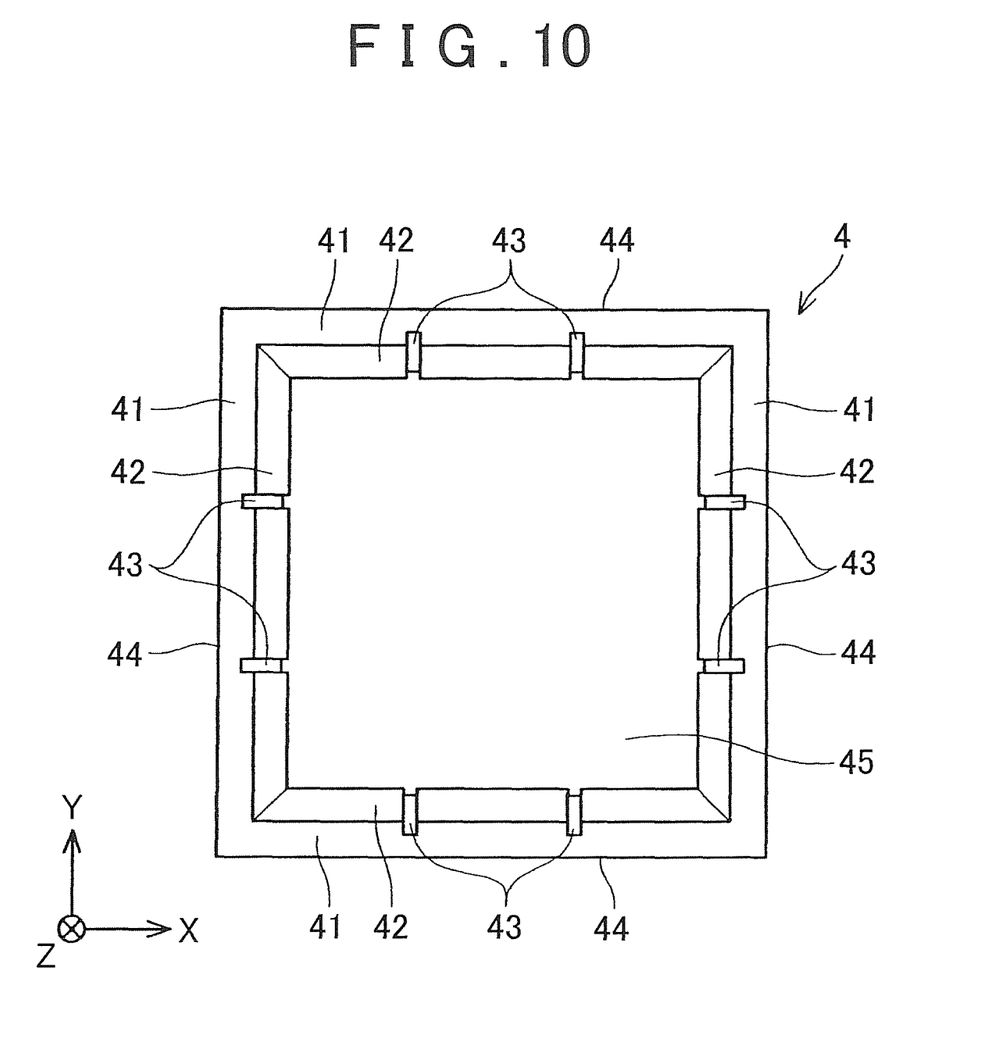
FIG. 10 is a bottom view of a back-side heat sink according to another embodiment.

Further, one groove 43 is formed per inclined plane 42 in the above embodiment, but the number of grooves 43 is not limited in particular, and for example, as illustrated in FIG. 10, a plurality of grooves 43 may be formed in each inclined plane 42. According to such a configuration, even if the semiconductor device 1 has a large area, it is possible to determine evenness of grinding based on positions of adjacent grooves 43. Further, a method of checking the evenness of the ground plane based on the grooves 43 is not limited to the above embodiment. For example, virtual lines are drawn from any given two grooves 43 in a vertical direction and in a lateral direction, and when the virtual lines intersect with each other at a right angle and with an equal length, the evenness can be determined to be maintained. Further, it is not always necessary to draw the virtual lines, and the evenness of the grinding may be determined based on coordinates of the grooves 43.

Figure 11:
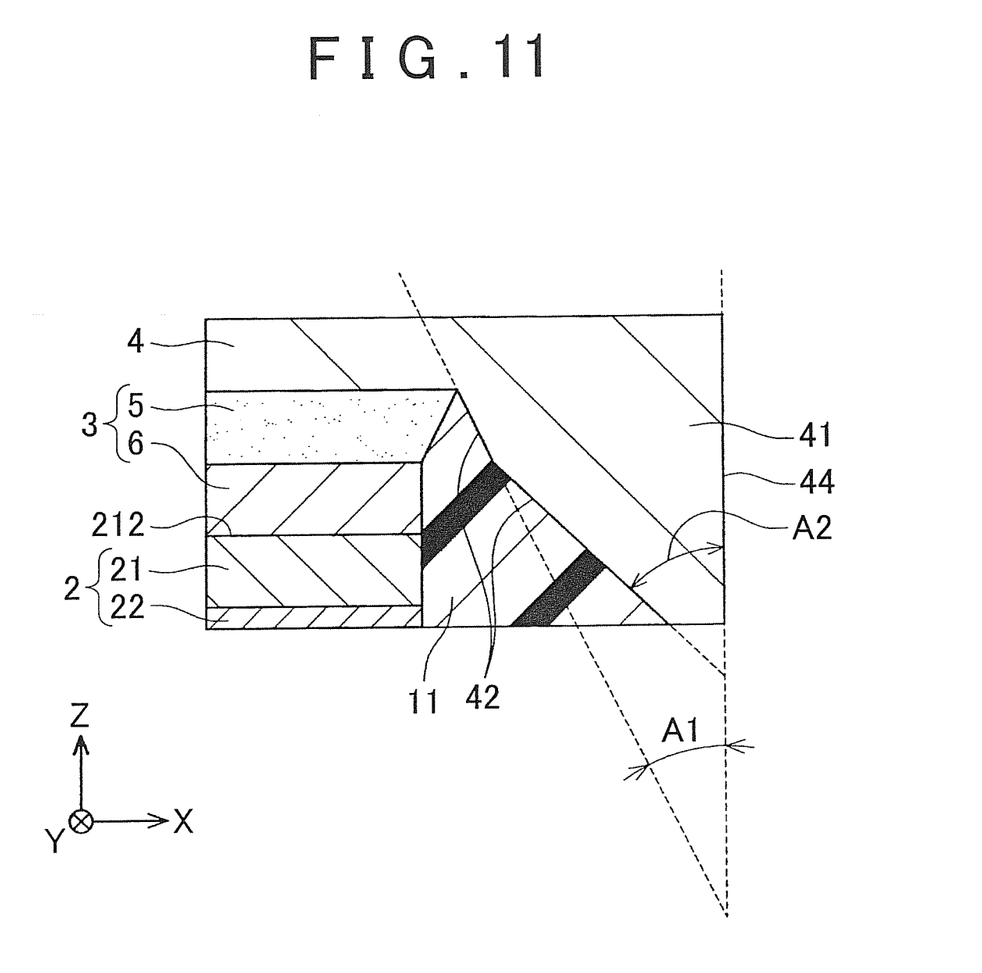
FIG. 11 is an enlarged view corresponding to FIG. 2 in terms of the semiconductor device according to another embodiment.

Further, in the above embodiment, the inclined plane 42 is configured to have one inclination angle "A," but the inclined plane 42 is not limited to this configuration, and the inclined plane 42 may be configured to have a plurality of inclination angles as illustrated in FIG. 11. In the example illustrated in FIG. 11, the inclined plane 42 has two inclination angles "A1, A2" so that the inclination angle changes in the middle. The inclined plane 42 in this example is configured such that an inclination angle with respect to the laminating direction is "A1" at a portion facing the back-side solder layer 5, and an inclination angle with respect to the laminating direction is "A2" at a portion facing the back-surface electrode 6. In such a configuration, the remaining thickness is measured by use of the inclination angle "A1" at the stage of grinding the back-side solder layer 5, and the remaining thickness is measured by use of the inclination angle "A2" at the stage of grinding the back-surface electrode 6. According to such a configuration, by changing the inclination angle of the inclined plane 42, it is possible to adjust a degree of external expansion of the inclined plane 42 that appears in the ground plane as the grinding proceeds, thereby making it possible to check the remaining thickness more accurately. Further, in this configuration, the inclination angle of the inclined plane 42 may be changed according to a target thickness for the grinding. For example, the inclination angle may be set to be small for the back-side solder layer 5 having a large layer thickness, while the inclination angle may be set to be large for the back-surface electrode 6 having a small layer thickness. Further, in this case, the shape of the groove 43 may be changed from a portion where the inclination angle is changed. For example, in a portion facing the back-side solder layer 5, the groove 43 may be formed in a quadrangular shape, and in a portion facing the back-surface electrode 6, the groove 43 may be formed in a triangular shape.

Further, in the above embodiment, a height position of one end (a bottom end) of the inclined plane 42 is the same as a height position of the back surface 212 of the substrate 21, but they may not necessarily be the same. As illustrated in FIG. 11, the height position of the one end (the bottom end) of the inclined plane 42 may extend downward more than the height position of the back surface 212 of the substrate 21. That is, the inclined plane 42 may be configured to extend so as to pass the height position of the back surface 212 of the substrate 21. Even with such a configuration, if the height of the inclined plane 42 is set in advance, it is possible to calculate the remaining thickness of the grinding-processed layer 3 and to check the evenness.

Figure 12:
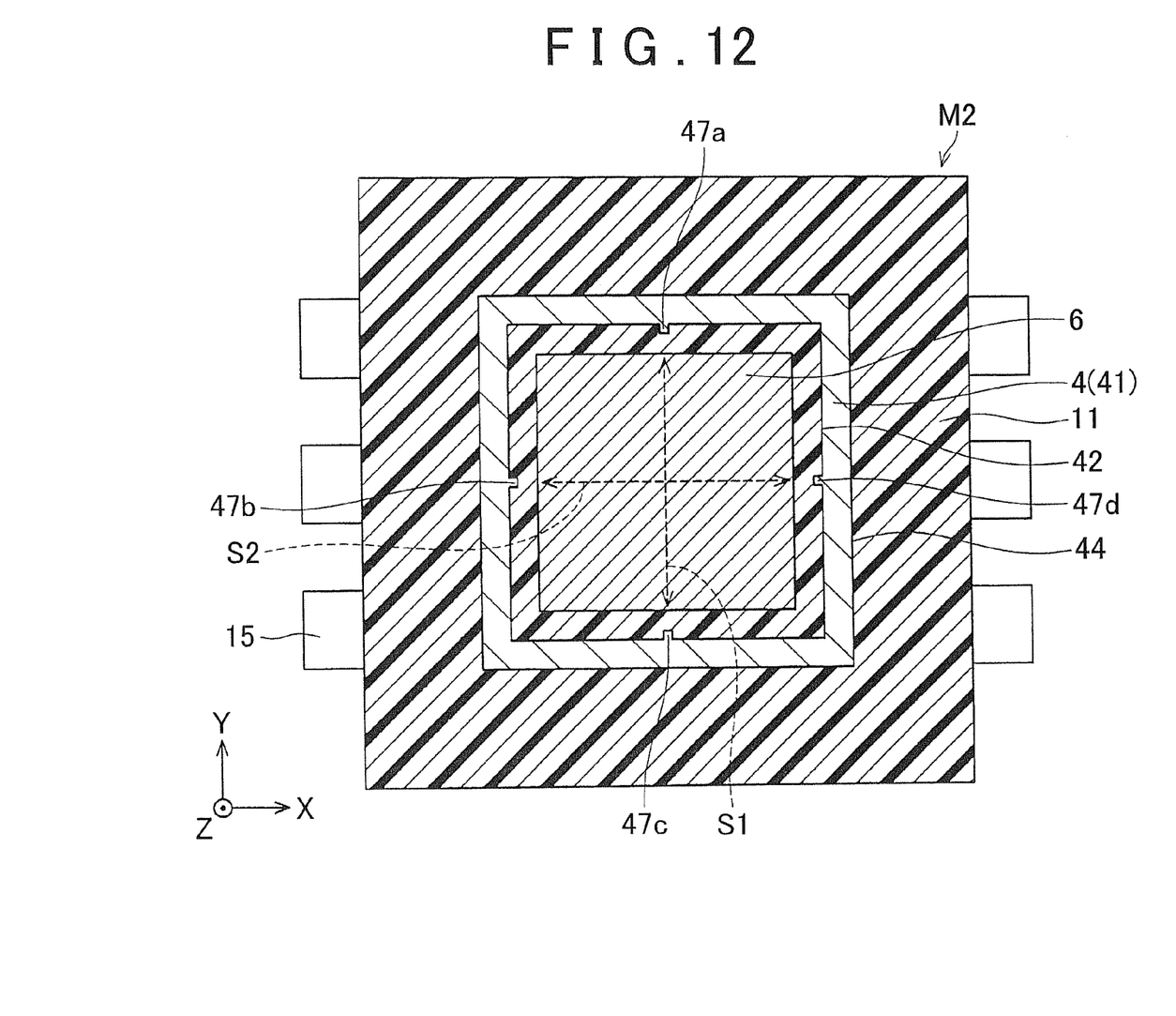
FIG. 12 is a plane view of the semiconductor device according to another embodiment at the time when a ground plane M2 is exposed.

Further, in the above embodiment, the grooves 43*a* to *d* are formed in the inclined planes 42, but the grooves may not necessarily be formed, but ridges may be formed. FIG. 12 is a sectional view of a ground plane M2 of a semiconductor device according to another embodiment. In the example illustrated in FIG. 12, ridges 47*a* to *d* projecting from surfaces of inclined planes 42 are formed. The ridges 47 extend in a direction inclined with respect to the laminating direction along the inclined planes 42 like the grooves 43. Even with such a configuration, it is possible to determine the evenness of the remaining thickness of the grinding-processed layer 3 based on those positions of the ridges 47 which appear in a ground plane instead of the grooves 43 when the semiconductor device 1 is ground.

Further, in the above embodiment, the back-side solder layer 5 and the back-surface electrode 6 constitute the grinding-processed layer 3, but the grinding-processed layer 3 is not limited to this. For example, in a case where a spacer or the like is laminated in addition to the back-side solder layer 5 and the back-surface electrode 6, the spacer or the like is also included in the grinding-processed layer 3. In addition, a layer of which a remaining thickness is to be checked when the semiconductor device 1 is ground is included in the grinding-processed layer 3. Further, in the above embodiment, the back surface 212 of the substrate 21 of the semiconductor chip 2 is the plane to be exposed, but the plane to be exposed is not limited to this, and can be changed. For example, a middle of the back-surface electrode 6 may be the plane to be exposed.

Further, the remaining-thickness checking portion may be a peripheral wall provided to surround the semiconductor chip in a plane view, but the remaining-thickness checking portion is not limited to this. The remaining-thickness checking portion may be a metal member, e.g., a column, provided adjacent to the semiconductor chip 2 in a plane view.

Further, in the above embodiment, those planes (the inclined planes 42) of the peripheral wall 41 (the remaining-thickness checking portion) which face the semiconductor chip 2 are inclined with respect to the laminating direction P, and those planes (the end surface 44) thereof which face sides opposite to the semiconductor chip 2 are parallel to the laminating direction P. Conversely, the planes facing the semiconductor chip 2 may be parallel to the laminating direction, and the planes facing the sides opposite to the semiconductor chip 2 may be inclined with respect to the laminating direction. That is, planes adjacent to the semiconductor chip 2 and inclined with respect to the laminating direction may be oriented in any direction.

Further, in the above embodiment, the grooves 43 are respectively provided in four sides of the peripheral wall 41 in a plane view. If the grooves 43 are provided in three places that are not provided on a straight line, it is possible to specify whether or not the ground plane is inclined with respect to the plane to be exposed. Further, when the grooves 43 are provided in at least two sides of the rectangular semiconductor chip 2 in a plane view, it is possible to check at least inclination of the ground plane around one axis parallel to the plane to be exposed.

The concrete embodiments of the invention have been described in detail, but these embodiments are only examples and do not limit the invention according to Claims. A technique according to Claims includes embodiments obtained by variously modifying or altering the concrete embodiments exemplified as above. Technical elements described in the present specification or the drawings exhibit a technical usability solely or in various combinations, and are not limited to combinations as described in Claims as of filing the present application. Further, the technique exemplified in the present specification or the drawings can achieve a plurality of objects at the same time, and has a technical usability by achieving one of those objects.

What is claimed is:

1. A semiconductor device comprising:
   a semiconductor chip fixed to a metal plate via a solder layer;
   a grinding-processed layer laminated on one surface of the semiconductor chip, the grinding-processed layer includes the solder layer;
   a sealing resin that seals the semiconductor chip and the grinding-processed layer; and
   a metal remaining-thickness checking portion provided adjacent to the grinding-processed layer, sealed by the sealing resin, and having an inclined plane that is inclined with respect to a laminating direction of the grinding-processed layer, the remaining-thickness checking portion is a wall provided adjacent to the solder layer so as to stand from the metal plate, the wall surrounds the semiconductor chip when the semiconductor chip is viewed in a plane manner, each of the inclined planes opposed to at least two sides of the semiconductor chip when viewed in the plane manner, is provided with a groove or a ridge extending along an inclination direction of each of the inclined planes.

2. The semiconductor device according to claim 1, wherein:
   the groove extending along the inclination direction of the each of the inclined planes, has a triangular shape.

3. The semiconductor device according to claim 1, wherein:
   a plurality of grooves extending along the inclination direction of the each of the inclined planes, are provided.

4. The semiconductor device according to claim 1, wherein:
   the groove extending along the inclination direction of the each of the inclined planes, includes a plurality of inclination angles.

5. A semiconductor device comprising:
   a semiconductor chip fixed to a metal plate via a solder layer;
   a grinding-processed layer laminated on one surface of the semiconductor chip, the grinding-processed layer includes the solder layer;
   a sealing resin that seals the semiconductor chip and the grinding-processed layer; and
   a metal remaining-thickness checking portion provided adjacent to the grinding-processed layer, sealed by the sealing resin, and having an inclined plane that is inclined with respect to a laminating direction of the grinding-processed layer, the remaining-thickness checking portion is a wall provided adjacent to the solder layer so as to stand from the metal plate, the inclined plane extends from a surface of the metal plate so as to reach a height corresponding to a plane to be exposed in the semiconductor chip.

* * * * *